United States Patent
Imamura et al.

(10) Patent No.: US 9,391,660 B2
(45) Date of Patent: Jul. 12, 2016

(54) WIRELESS RECEIVER AND WIRELESS RECEIVING METHOD

(71) Applicant: Panasonic Corporation, Osaka (JP)

(72) Inventors: Koji Imamura, Shiga (JP); Takayuki Abe, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/404,387

(22) PCT Filed: Mar. 12, 2014

(86) PCT No.: PCT/JP2014/001415
§ 371 (c)(1),
(2) Date: Nov. 26, 2014

(87) PCT Pub. No.: WO2014/141707
PCT Pub. Date: Sep. 18, 2014

(65) Prior Publication Data
US 2015/0188587 A1    Jul. 2, 2015

(30) Foreign Application Priority Data

Mar. 14, 2013  (JP) .................................. 2013-052225

(51) Int. Cl.
*H04B 1/38* (2015.01)
*H04B 1/16* (2006.01)
(Continued)

(52) U.S. Cl.
CPC .. *H04B 1/16* (2013.01); *H03D 7/16* (2013.01); *H04W 52/0229* (2013.01); *H04W 52/0238* (2013.01); *Y02B 60/50* (2013.01)

(58) Field of Classification Search
CPC ............... Y02B 60/50; H04W 52/028; H04W 52/0235; H04N 1/00891

USPC ............. 455/574, 343.1, 343.2, 343.3, 343.4, 455/343.5

See application file for complete search history.

(56) References Cited

U.S. PATENT DOCUMENTS 5,027,428 A     6/1991  Ishiguro et al.
6,633,753 B1 *  10/2003 Kido ................. H04W 52/0229
                                                            340/7.34

(Continued)

FOREIGN PATENT DOCUMENTS

JP      02-72724 A    3/1990
JP      08-139635 A   5/1996

(Continued)

OTHER PUBLICATIONS

International Search Report dated May 27, 2014, for corresponding International Application No. PCT/JP2014/001415, 5 pages.

*Primary Examiner* — Sonny Trinh
(74) *Attorney, Agent, or Firm* — Seed Intellectual Property Law Group PLLC

(57) ABSTRACT

A wireless receiver capable of realizing both reduction of electricity consumption and stable activation is provided. The wireless receiver includes: a power detector which detects power of a received signal; a first pattern detector which detects a predetermined signal pattern included in the received signal; a wireless communicator which performs wireless communication; a pattern detection activator which activates the first pattern detector when the power detector detects the power of the received signal; and a wireless communication activator which activates the wireless communicator when the first pattern detector detects the predetermined signal pattern in the received signal.

12 Claims, 14 Drawing Sheets

(51) Int. Cl.
*H04W 52/02* (2009.01)
*H03D 7/16* (2006.01)

(56) References Cited

U.S. PATENT DOCUMENTS

| | | | |
|---|---|---|---|
| 8,532,718 B2* | 9/2013 | Behzad | H04W 52/0229 455/343.2 |
| 8,588,708 B2* | 11/2013 | Minemura | H04W 56/0035 370/311 |
| 8,676,150 B2* | 3/2014 | Leoncavallo | H04W 52/0245 455/343.1 |
| 2009/0121846 A1* | 5/2009 | Rye | H04B 3/56 340/12.37 |
| 2010/0040120 A1 | 2/2010 | Sharma | |
| 2011/0222516 A1* | 9/2011 | Kurose | H04M 1/7253 370/338 |
| 2011/0273276 A1* | 11/2011 | Minemura | H04W 52/0235 340/10.1 |
| 2013/0195209 A1 | 8/2013 | Sharma | |

FOREIGN PATENT DOCUMENTS

| | | |
|---|---|---|
| JP | 2003-134027 A | 5/2003 |
| JP | 2005-333351 A | 12/2005 |
| JP | 2011-527873 A | 11/2011 |

* cited by examiner

INTERMODULATION COMPONENT

WIRELESS RECEIVER AND WIRELESS RECEIVING METHOD

TECHNICAL FIELD

This disclosure relates to wireless receivers and wireless receiving methods.

BACKGROUND ART

As methods of reducing electricity consumption of wireless terminals of the related art, various methods have been proposed. For example, there is known a wake-up type wireless apparatus which includes a wireless communicator for transmitting and receiving a data signal and a receiver for reception.

In the wake-up type wireless apparatus, the wireless communicator basically operates, for example, in an OFF state not being supplied with power or a sleep mode of low consumption not performing a receiving standby operation. In the wake-up type wireless apparatus, when the receiver for reception detects a wake-up signal transmitted from a transmitter before starting the transmission/reception of the data signal, power supply to the wireless communicator is started.

As the wake-up type wireless apparatus, there is known a wireless communication apparatus which includes a wireless communicator for communication and an envelope detector and is configured to start pattern detection depending on the presence/absence of power in a predetermined band and start the wireless communicator when the pattern transmitted to the own wireless apparatus is detected (see patent literature 1, for instance).

CITATION LIST

Patent Literature

Patent Literature 1: JP-A-8-139635

SUMMARY OF INVENTION

Technical Problem

The wireless communication apparatus of the patent literature 1 has a difficulty in realizing both the reduction of consumption and the stable activation of the wireless communication apparatus.

This disclosure has been developed in consideration of the situation, and provides a wireless receiver and a wireless communication method each of which can realize both the reduction of electricity consumption and the stable activation.

Solution to Problem

The wireless receiver according to this disclosure includes: a power detector which detects power of a received signal; a first pattern detector which detects a predetermined signal pattern included in the received signal; a wireless communicator which performs wireless communication; a pattern detection activator which activates the first pattern detector when the power detector detects power of the received signal; and a wireless communication activator which activates the wireless communicator when the first pattern detector detects the predetermined signal pattern in the received signal.

Advantageous Effects of Invention

According to this disclosure, both the reduction of electricity consumption and stable activation can be realized.

DESCRIPTION OF EMBODIMENTS

Embodiments of this disclosure will be explained with reference to drawings.

[Circumstances Leading to a Mode of this Disclosure]

Figure 13:
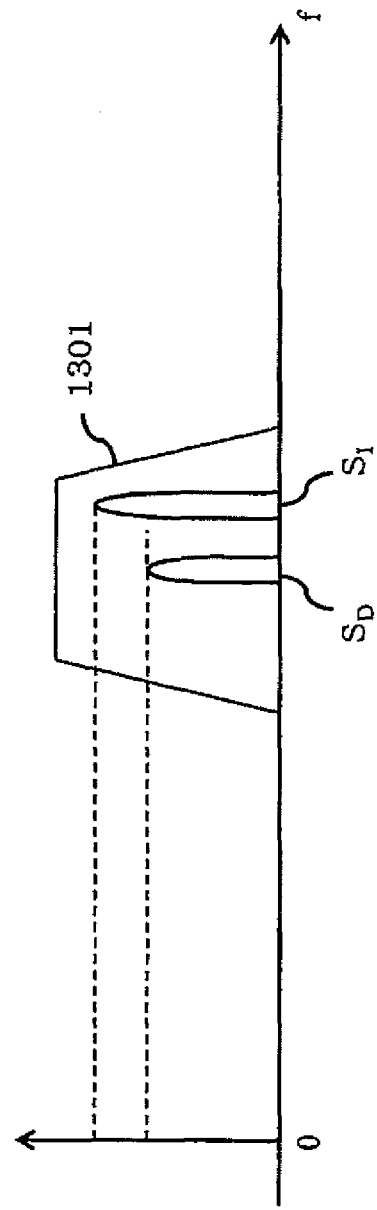
FIG. 13 is a schematic diagram showing an example of the frequency spectrum of the received signal having been subjected to a frequency conversion, according to a related art.

A filter 1301 (see FIG. 13) provided in the wireless communication apparatus of the patent literature 1 has a wide signal pass band in the RF (radio frequency) band. In this case, when both a desired signal $S_D$ and an interference signal $S_I$ exist within the signal pass band of the filter 1301 shown in FIG. 13, the desired signal $S_D$ and the interference signal $S_I$ are overlapped on the time axis shown in Section (A) of FIG. 14. Thus, as shown in Section (B) of FIG. 14, a predetermined signal pattern cannot be detected from a signal extracted through a square operation.

Figure 14:
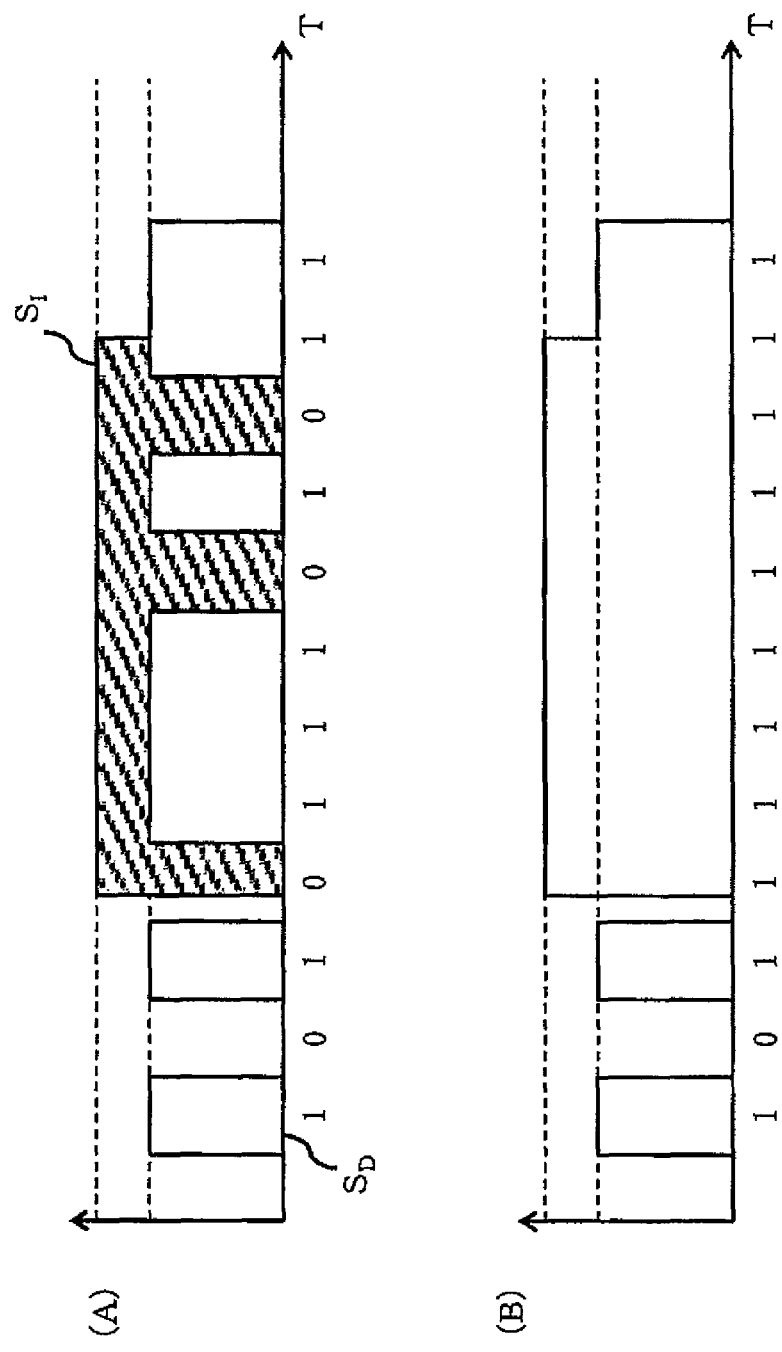
FIG. 14 Each of Section (A) and (B) is a schematic diagram showing a signal on the time axis corresponding to the received signal of the related art.

For example, supposing that the pattern of the desired signal $S_D$ is "1010 1110 1011" shown in Section (A) of FIG. 14, the signal extracted through the square operation becomes "1011 1111 1111" shown in Section (B) of FIG. 14. In this case, the desired signal $S_D$ cannot be detected as the predetermined signal pattern. In other words, even if a wake-up packet is received, the desired signal $S_D$ cannot be detected due to the interference. Thus, there sometimes arises a case that the wireless communicator cannot be activated and hence a system cannot be established.

Hereinafter, explanation will be made as to a wireless receiver and a wireless communication method each of which can realize both the reduction of electricity consumption and the stable activation.

In each of embodiments explained below, a wireless transmitter and a wireless receiver are connected to a wireless communication line to thereby constitute a wireless communication system. For example, a wireless system between sensors which independently collects states between devices or sensing information is formed. The wireless system includes a WPAN (Wireless Personal Area Network), an M2M (Machine to Machine) communication system or a sensor wireless network system, for example. The wireless communication system is a wake-up type communication system.

The transmission speed of each of the wireless transmitter and the wireless receiver is low (in a range from several kbps to several hundred kbps) for example, and a reaching distance of the wireless signal is short (in a range from several meters to about several ten meters). Each of the wireless transmitter and the wireless receiver is compact, for example, and can be operated during several years by a battery. Each of the wireless transmitter and the wireless receiver may perform communication using microwaves or millimeter waves.

In the embodiments described below, a modulation system (OOK (On Off Keying)) superimposing information on the amplitude is employed as an example.

First Embodiment

Figure 1:
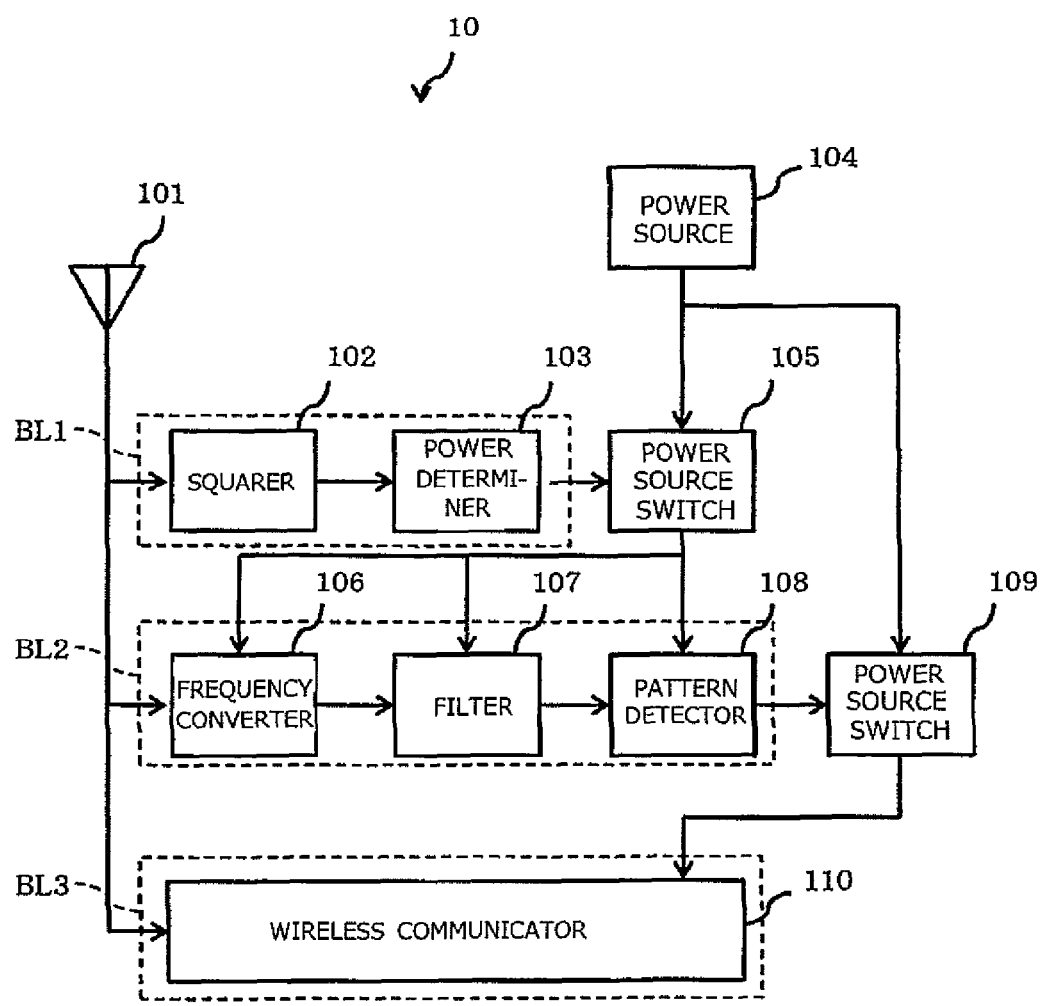
FIG. 1 is a block diagram showing an example of a configuration of a wireless receiver according to a first embodiment.

FIG. 1 is a block diagram showing an example of the configuration of a wireless receiver 10 according to the first embodiment. The wireless receiver 10 includes an antenna 101, a squarer 102, a power determiner 103, a power source 104, a power source switch 105, a frequency converter 106, a filter 107, a pattern detector 108, a power source switch 109 and a wireless communicator 110 for communication.

The squarer 102 and the power determiner 103 are contained in a first block BL1. The frequency converter 106, the filter 107 and the pattern detector 108 are contained in a second block BL2. The wireless communicator 110 is contained in a third block BL3. The second block BL2 has a function as a first pattern detector for detecting a predetermined pattern included in a received signal.

The antenna 101 receives a wake-up signal or a data signal transmitted from a communication partner in a receiving standby state of a wireless signal. The antenna 101 outputs the received signal to the squarer 102, the frequency convertor 106 and the wireless communicator 110. The wake-up signal or the data signal is a desired signal $S_D$ destined to the wireless receiver 10, for example.

The receiving standby state of the wireless signal represents a period until the pattern is detected and the wireless communicator 110 is activated, for example.

The squarer 102 receives the received signal from the antenna 101, then performs the square operation of the received signal and outputs a squared signal to the power determiner 103.

The power determiner 103 inputs the squared signal from the squarer 102 and filters the squared signal to thereby extract envelope information of the received signal. Further, the power determiner 103 determines the existence/nonexistence of power based on the envelope information of the received signal, and outputs a power determination signal including the determination result to the power source switch 105.

For example, when the power determination signal represents that the envelope information is a predetermined value or more, a value representing that the power of the received signal exists is outputted. For example, "H (High)" is allocated as the value representing that the power of the received signal exists, whilst "L (Low)" is allocated as a value representing that the power of the received signal does not exist.

The power source 104 supplies power to the respective blocks. Incidentally, supply of power to each of the frequency converter 106, the filter 107 and the pattern detector 108 is controlled by the power source switch 105. Supply of power to the wireless communicator 110 is controlled by the power source switch 109.

The power source switch 105 inputs the power determination signal from the power determiner 103. The power source switch 105 controls the supply of power from the power source 104 to the frequency converter 106, the filter 107 or the pattern detector 108 depending on the existence/nonexistence of power of the received signal represented by the power determination signal.

For example, when the power determination signal is "H", the power source switch 105 supplies power to the frequency converter 106, the filter 107 and the pattern detector 108. In contrast, when the power determination signal is "L", the power source switch 105 does not supply power to any of the frequency converter 106, the filter 107 and the pattern detector 108. The power source switch 105 is an example of a pattern detection activator which activates the respective constituent elements of the second block BL2 when the power of the received signal is detected.

When the power determiner 103 determines that the power of the received signal exists, each of the frequency converter 106, the filter 107 and the pattern detector 108 is supplied with power from the power source 104 and starts its operation. That is, each of the respective constituent elements of the second block BL2 is activated when the power of the received signal is detected.

The frequency converter 106 inputs the received signal from the antenna 101. The frequency converter 106 multiplies the received signal by an LO (Local Oscillator) signal having a predetermined frequency to thereby perform a frequency conversion, and outputs a down converted signal containing the multiplication result to the filter 107. The down converted signal is an example of a frequency-converted received signal.

Further, the frequency converter 106 includes, for example, a mixer or an LO signal oscillator, and processes the received signal by a known pattern unit or a bit unit of 2 bits or more. Thus, electricity consumption of the frequency converter is relatively larger as compared with other constituent elements, for example, the respective constituent elements of the first block BL1.

The filter 107 (an example of a band limiter) inputs the down converted signal from the frequency converter 106. The filter 107 limits the frequency band of the down converted signal in a manner of passing the signal component of a signal pass band and cutting off the signal component of the remaining band, and outputs a band limited signal to the pattern detector 108. The band limited signal is an example of the received signal which frequency band is limited.

For example, in the wireless communication system of this embodiment, communication can be performed using a plurality of communication channels. The plurality of communication channels are arranged with a constant interval on a frequency axis. As an example, a half of the frequency interval of the communication channels is set as the bandwidth of the signal pass band of the filter 107. Thus, influence from signals transmitted on the adjacent communication channels can be eliminated and influence of the adjacent channels can be reduced. Further, the bandwidth of the signal pass band of the filter 107 may be set according to the modulation system.

The pattern detector 108 (an example of a second pattern detector) inputs the band limited signal supplied from the filter 107, then determines whether or not the band limited signal has the predetermined pattern, and outputs a pattern detection signal containing the determination result to the power source switch 109. The pattern detector 108 performs a correlation calculation, for example, between a known arbitrary signal pattern (known pattern) and the band limited signal to obtain a correlation value, and determines the correlation value using a threshold value.

The known pattern includes, for example, the pattern of the wake-up signal, the pattern of a preamble or a pattern for discriminating the wireless receiver 10. The pattern for discriminating the wireless receiver 10 includes, for example, an IP (Internet Protocol) address or an MAC (Media Access Control) address. In the determination using the threshold, for example, it is determined that the correlation exists when the correlation value is the threshold or more, whilst it is determined that the correlation does not exist when the correlation value is less than the threshold.

The band limited signal to be inputted into the pattern detector 108 is a signal which is frequency-converted by the frequency converter 106 into a frequency lower than that of the RF band signal as the received signal and further subjected to the frequency band limiting by the filter 107.

Figure 2:
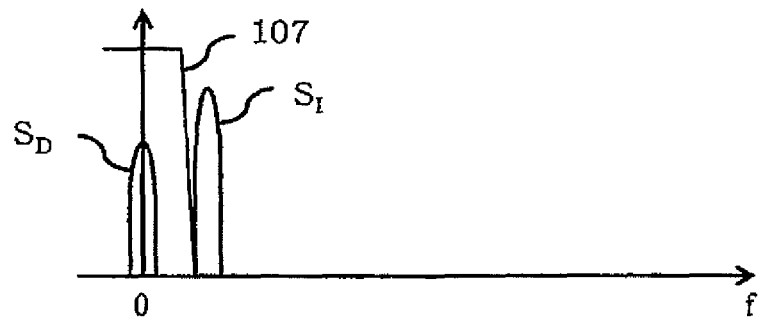
FIG. 2 is a schematic diagram showing an example of a frequency spectrum of a received signal having been subjected to a frequency conversion, according to the first embodiment.
Figure 3:
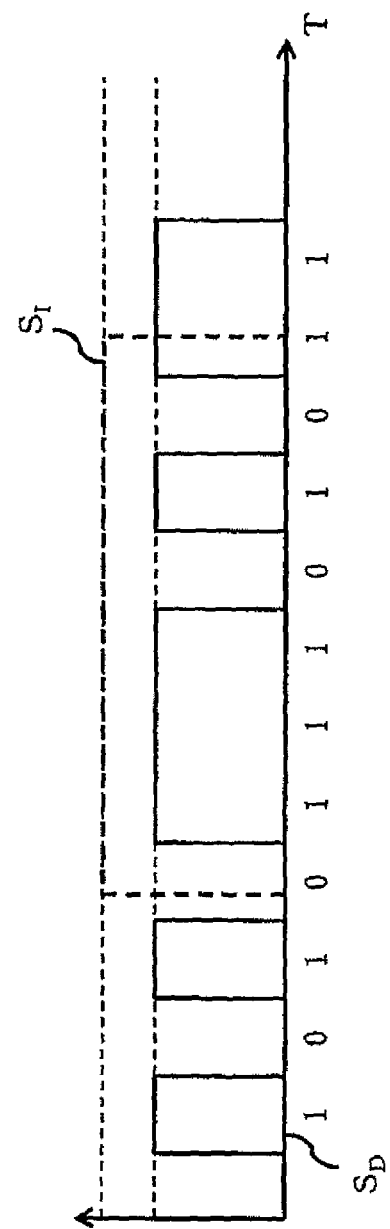
FIG. 3 is a schematic diagram showing an example of a signal on the time axis corresponding to the received signal in the first embodiment.

Thus, as shown in FIG. 2, even when the interference signal $S_I$ exists within the signal pass band of the filter 107 in addition to the desired signal $S_D$, the component of the interference signal $S_I$ can be eliminated by the frequency band limiting. When a phenomenon shown in FIG. 2 is observed temporally, the band limited signal on the time axis does not contain the component of the interference signal $S_I$, as shown in FIG. 3. Incidentally, in FIG. 2, the frequency "0" on the frequency axis does not represent 0 (Hz) but represents a predetermined reference frequency. Further, the interference signal $S_I$ is, for example, a signal transmitted to another wireless receiver from another wireless transmitter.

When the correlation value thus obtained is the threshold or more, for example, a value representing the predetermined pattern is outputted as the pattern detection signal. For example, "H (High)" is allocated as a value representing that the predetermined pattern exists, whilst "L (Low)" is allocated as a value representing that the predetermined pattern does not exist.

The pattern detector 108 includes, for example, a correlator and subjects the received signal to a correlation calculation by a bit unit. Thus, electricity consumption of the pattern detector is relatively larger as compared with other constituent elements, for example, the respective constituent elements of the first block BL1.

The power source switch 109 inputs the pattern detection signal from the pattern detector 108, and controls the supply of power from the power source 104 to the wireless communicator 110 depending on whether or not the predetermined signal pattern (signal pattern of the desired signal $S_D$, for example) is detected.

For example, when the pattern detection signal is "H", the power source switch 109 supplies power to the wireless communicator 110. In contrast, when the pattern detection signal is "L", the power source switch 109 does not supply power to the wireless communicator 110. The power source switch 109 is an example of a wireless communication activator which activates the wireless communicator 110 when the predetermined signal pattern is detected from the received signal.

The wireless communicator 110 includes, for example, a modulator and subjects the received signal to a demodulation processing by a bit unit. Thus, electricity consumption of the wireless communicator is relatively larger as compared with other constituent elements, for example, the respective constituent elements of the first block BL1 and the second block BL2.

When the pattern detector 108 detects the predetermined pattern, the wireless communicator 110 is supplied with power and starts its operation. In other words, when the predetermined pattern is detected from the received signal, the third block is activated. As a result, the operation time of the wireless communicator 110 of relatively large electricity consumption can be reduced, and hence electricity consumption in the receiving standby state can be reduced.

In this manner, the wireless receiver 10 activates the respective constituent elements of the second block BL2 in response to the detection of the power of the received signal. Further, the wireless receiver 10 activates the wireless communicator 110 of the third block BL3 in response to the detection of the predetermined signal pattern.

According to the wireless receiver 10, the second block BL2 and the third block BL3 are activated stepwise in response to each the detection of the power of the received signal and the predetermined signal pattern. Thus, the operation time of the blocks of relatively large electricity consumption can be reduced, and electricity consumption in the receiving standby state can be reduced.

Further, the second block BL2 executes the frequency conversion and the filtering to thereby perform the pattern detection as to the signal from which the influence of the interference signal $S_I$ is removed. Thus, the interference resistance of the wireless receiver 10 can be improved. As a result, the predetermined signal pattern can be detected even under the existence of interference and so the wireless communicator 110 can be activated stably.

Accordingly, both the reduction of electricity consumption and the stable activation can be realized. Further, for example, the reduction of electricity consumption and the stable activation of the sensor wireless network system including the wireless receiver 10 can be realized.

Second Embodiment

Figure 4:
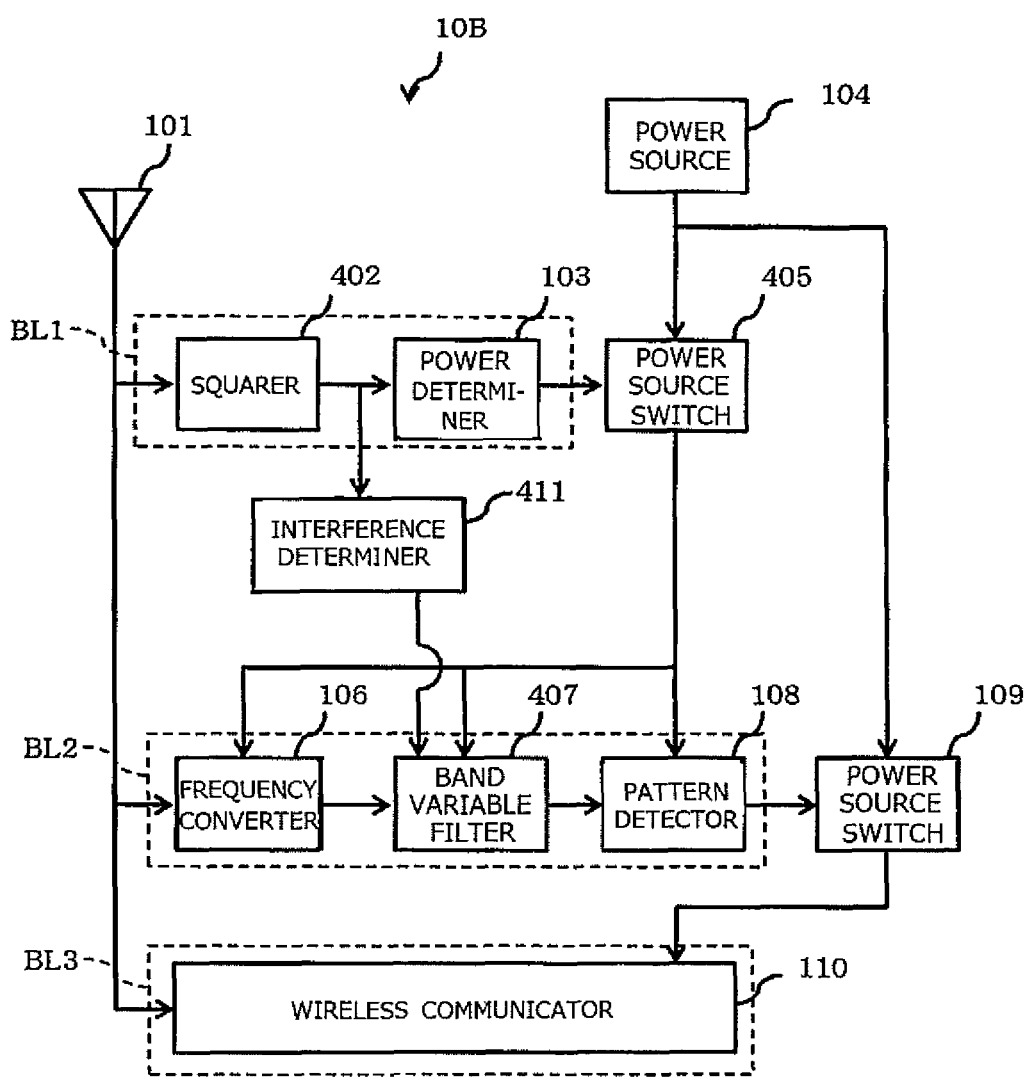
FIG. 4 is a block diagram showing an example of a configuration of a wireless receiver according to a second embodiment.

FIG. 4 is a block diagram showing an example of the configuration of a wireless receiver 10B according to the second embodiment. The wireless receiver 10B includes an antenna 101, a squarer 402, a power determiner 103, a power source 104, a power source switch 405, a frequency converter 106, a band variable filter 407, a pattern detector 108, a power source switch 109, a wireless communicator 110 and an interference determiner 411. In the wireless receiver 10B, constituent elements identical to those of the wireless receiver 10 shown in FIG. 1 are referred to by the common symbols, with explanation thereof being omitted or simplified.

The squarer 402 inputs the received signal from the antenna 101, then performs the square operation of the received signal and outputs the squared signal to the power determiner 103 and the interference determiner 411.

The power source switch 405 inputs the power determination signal from the power determiner 103. The power source switch 405 controls the supply of power from the power source 104 to the frequency converter 106, the band variable filter 407 or the pattern detector 108 depending on the existence/nonexistence of power of the received signal represented by the power determination signal.

For example, when the power determination signal is "H", the power source switch 405 supplies power to the frequency converter 106, the band variable filter 407 and the pattern detector 108. In contrast, when the power determination signal is "L", the power source switch 405 does not supply power to any of the frequency converter 106, the band variable filter 407 and the pattern detector 108.

When the power determiner 103 determines that power of the received signal exists, the band variable filter 407 is supplied with power from the power source 104 and starts its operation. The band variable filter 407 inputs the down converted signal from the frequency converter 106 and an interference determination signal from the interference determiner 411.

The band variable filter 407 controls the filter characteristic (attenuation characteristic of the filter, bandwidth of the filter, for example) thereof depending on the existence/nonexistence of the interference determination signal. The attenuation characteristic of the filter includes an attenuation gradient. The attenuation gradient represents the attenuation characteristic in the transfer band TB of the filter, and corresponds to the gradient of a straight line L contained in the transfer band TB on a frequency axis (see Section (A) of FIG. 8). For example, the order of the filter or the bandwidth of the filter is an example of parameters used in the second block BL2.

When the interference determination signal represents that interference exists, the band variable filter 407 limits the frequency band in a pass band of a narrow bandwidth or steep characteristic, and outputs a band limited signal to the pattern detector 108. Thus, the interference signal $S_I$ is suppressed from being contained within the signal pass band of the band variable filter 407.

The narrow bandwidth means, for example, that the bandwidth of the signal pass band is smaller than a predetermined bandwidth. The steep characteristic means, for example, that the attenuation gradient of the filter is a predetermined gradient or more.

When the interference determination signal represents that interference does not exist, the band variable filter 407 limits the frequency band in a signal pass band of a wide bandwidth or gentle characteristic, and outputs the band limited signal to the pattern detector 108. Thus, electricity consumption of the band variable filter 407 can be reduced.

The wide bandwidth means, for example, that the bandwidth of the signal pass band is equal to or larger than the predetermined bandwidth. The gentle characteristic means, for example, that the attenuation gradient of the filter is smaller than the predetermined gradient.

The interference determiner 411 inputs the squared signal from the squarer 402, then determines the existence/nonexistence of interference based on an intermodulation component contained in the squared signal and outputs an interference determination signal including the determination result to the band variable filter 407. The intermodulation component is a component appearing at a frequency equal to a frequency difference between the desired signal $S_D$ and the interference signal $S_I$ by subjecting each of the desired signal $S_D$ and the interference signal $S_I$ to the square operation.

Consideration will be made as to a case where both the desired signal $S_D$ and the interference signal $S_I$ exist and a frequency difference between the desired signal $S_D$ and the interference signal $S_I$ is $f_{diff}$, as shown in Section (A) of FIG. 5.

A composite signal of the desired signal $S_D$ and the interference signal $S_I$ as the received signal is represented by the following expression (1), for example.

$$\cos(2*\pi*f_D*t)+\cos(2*\pi*f_I*t) \quad (1)$$

The asterisk "*" represents multiplication.

In this case, the squared signal obtained by squaring the composite signal is represented by the following expression (2).

$$\{\cos(2*\pi*f_D*t) + \cos(2*\pi*f_I*t)\}^2 = \quad (2)$$
$$\cos^2(2*\pi*f_D*t) + 2\cos(2*\pi*f_D*t)\cos(2*\pi*f_I*t) +$$
$$\cos^2(2*\pi*f_I*t) = \cos^2(2*\pi*f_D*t) + \cos(2*\pi*(f_D - f_I)*t) +$$
$$\cos(2*\pi*(f_D + f_I)*t) + \cos^2(2*\pi*f_I*t) =$$
$$1 + \cos(2*\pi*2*f_D*t)/2 + \cos(2*\pi*(f_D - f_I)*t) +$$
$$\cos(2*\pi*(f_D + f_I)*t) + \cos(2*\pi*2*f_I*t)/2$$

Figure 5:
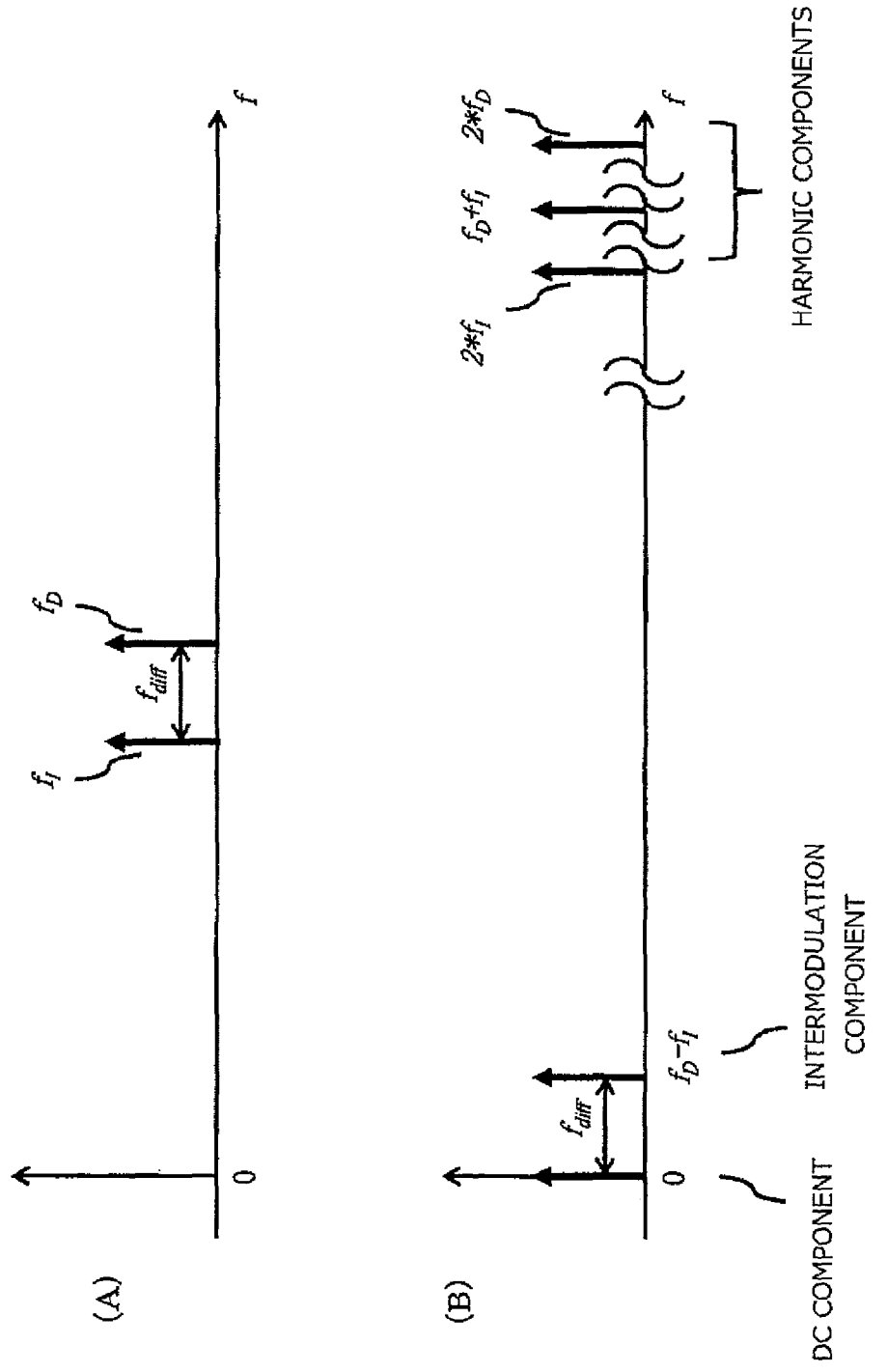
FIG. 5 Section (A) of FIG. 5 is a schematic diagram showing an example of a frequency spectrum of the received signal according to the second embodiment, and Section (B) of FIG. 5 is a schematic diagram showing an example of a frequency spectrum of the received signal having been subjected to a square operation, according to the second embodiment.

The squared signal shown in the expression (2) and Section (B) of FIG. 5 includes a DC component, harmonic components of frequencies $2*f_D$, $2*f_I$ and $f_D+f_I$, and an intermodulation component of a frequency $f_D-f_I$ ($=f_{diff}$).

On the other hand, when the interference signal $S_I$ does not exist, the received signal is the desired signal $S_D$ and is represented by the following expression (3), for example.

$$\cos(2*\pi*f_D*t) \quad (3)$$

In this case, the squared signal obtained by squaring the received signal is represented by the following expression (4).

$$\cos^2(2*\pi*f_D*t)=\{1+\cos(2*\pi*2*f_D*t)\}/2 \quad (4)$$

The squared signal represented by the expression (4) includes a DC component and harmonic components but does not include an intermodulation component.

Figure 6:
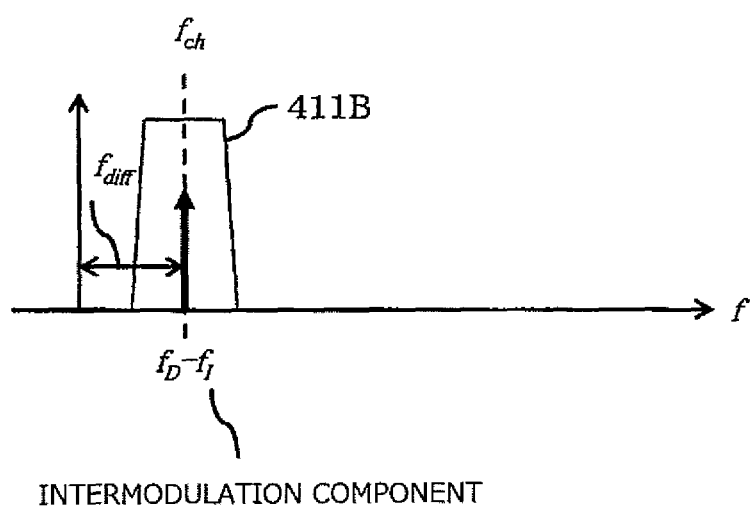
FIG. 6 A schematic diagram showing an example of a frequency spectrum of an intermodulation component and the pass band of a filter for determining interference, according to the second embodiment.

The interference determiner 411 determines the existence/nonexistence of the interference signal $S_I$ by utilizing the properties shown in the expressions (2) and (4), for example, by using the an interference determination filter 411B. As shown in FIG. 6, the interference determination filter 411B has a predetermined bandwidth containing a center frequency $f_{ch}$.

The interference determination 411 removes the DC component and the harmonic components by using the interference determination filter 411B, for example, and determines the existence/nonexistence of the interference signal $S_I$ based on the power of the signal around the frequency $f_{ch}$. In this case, the center frequency $f_{ch}$ of the interference determination filter 411B is designed to a frequency corresponding to the interval of the respective communication channels or a frequency interval at which the interference signal $S_I$ influences on the desired signal $S_D$.

As shown in FIG. 6, when the frequency difference $f_{diff}$ between the desired signal $S_D$ and the interference signal $S_I$ is almost same as the frequency $f_{ch}$, the intermodulation component of the squared signal passes the interference determination filter 411B, whereby the interference determiner 411 detects the power of the signal. Thus, the determination can be made that the interference signal $S_I$ exists.

Further, consideration will be made as to a case that, as shown in Section (A) of FIG. 7, the interference signal $S_I$ exists in a channel separated by a predetermined frequency or more from the desired signal $S_D$, that is, a frequency difference $f'_{diff}$ is larger than the frequency difference $f_{diff}$ shown in FIG. 6.

Figure 7:
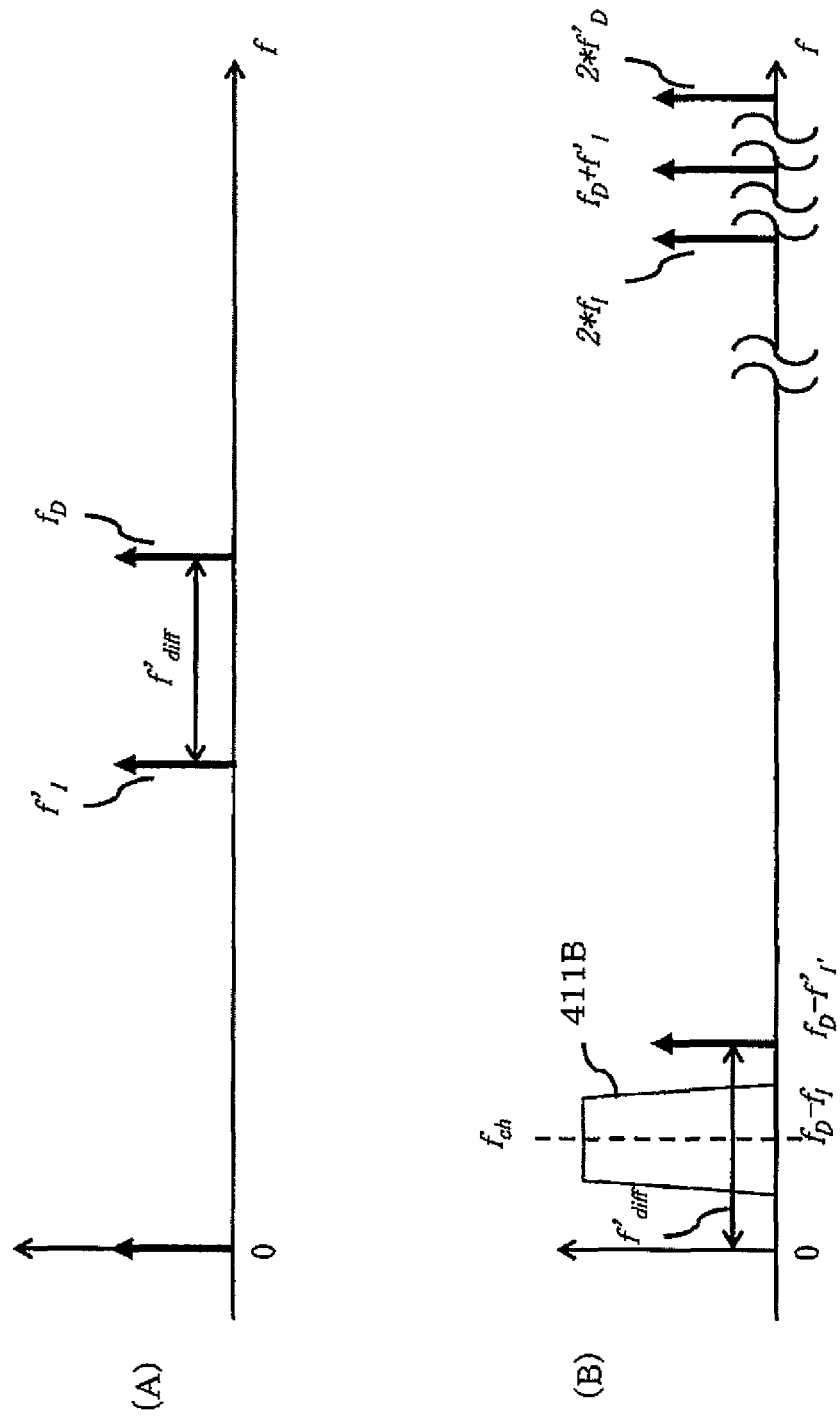
FIG. 7 Section (A) of FIG. 7 is a schematic diagram showing an example of a frequency spectrum of a received signal in a case that an interference signal exists in a channel separated by a predetermined frequency or more from a desired signal, according to the second embodiment, and Section (B) of FIG. 7 is a schematic diagram showing an example of a frequency spectrum of the received signal having been subjected to the square operation in a case that the interference signal exists in a channel separated by a predetermined frequency or more from the desired signal, according to the second embodiment.

In this case, as shown in Section (B) of FIG. 7, the intermodulation component of the squared signal appears in the frequency difference $f'_{diff}$. The frequency difference $f'_{diff}$ exists outside of the signal pass band of the interference determination filter 411B. Thus, since the intermodulation component of the squared signal does not pass the interference determination filter 411B, the interference determiner 411 does not detect the power of the signal. Accordingly, the determination can be made that the interference signal $S_I$ does not exist.

In this manner, the interference determiner 411 determines the existence/nonexistence of the intermodulation component of the squared signal to thereby determine the existence/nonexistence of the interference signal $S_I$ capable of influencing on the desired signal $S_D$.

Next, the explanation will be made as to the filter characteristic of the band variable filter 407.

In the band variable filter 407, the characteristic of the signal pass band changes when the filter order is changed. An active filter, for example, is used as the band variable filter 407. In the band variable filter 407, the attenuation gradient is large when the filter order is large, and hence an operational amplifier is required, for example. Thus, in this case, the electricity consumption is large. On the other hand, in the band variable filter 407, the attenuation gradient is small when the filter order is small, and hence the electricity consumption is small. Accordingly, the electricity consumption can be reduced and the stable activation can be realized by using the band variable filter 407 having an optimum filter order according to the determination result as to the existence/nonexistence of the interference signal $S_I$.

Figure 8:
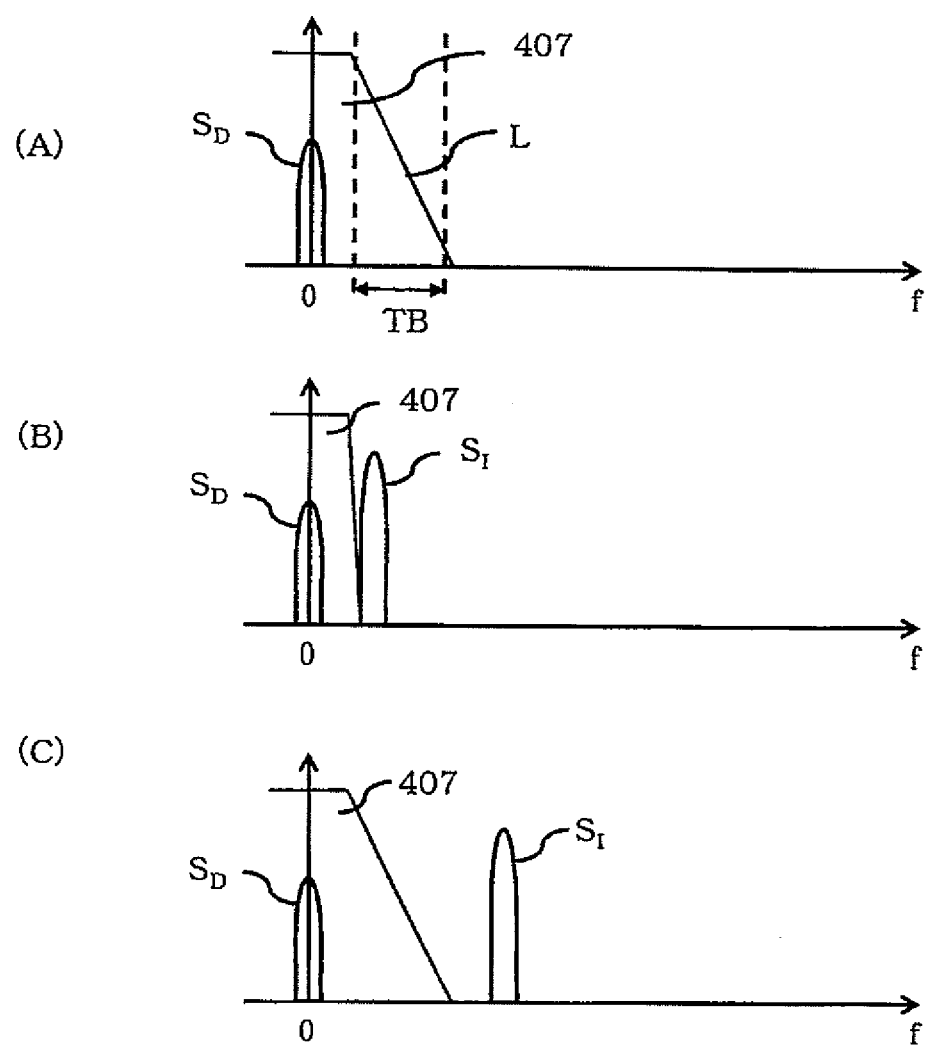
FIG. 8 Each of Section (A) to Section (C) of FIG. 8 is a schematic diagram showing an example of a frequency spectrum of the received signal and the pass band of a band variable filter, according to the second embodiment.

In Section (A) of FIG. 8, since the interference signal $S_I$ does not exist, there is no influence on the desired signal $S_D$ from the interference signal $S_I$. In this case, for example, when the gentle characteristic is set by reducing the filter order, both the reduction of electricity consumption and the pattern detection with high accuracy can be realized.

In Section (B) of FIG. 8, the interference signal $S_I$ exists at a frequency in the vicinity of the frequency allocated to the desired signal $S_D$. In this case, for example, when the steep characteristic is set by increasing the filter order, the interference signal $S_I$ can be removed and the pattern can be detected with high accuracy.

In Section (C) of FIG. 8, the interference signal $S_I$ exists at a frequency separated by a predetermined frequency or more from the frequency allocated to the desired signal $S_D$. In this case, even when the gentle characteristic is set by reducing the filter order, there is no influence on the desired signal $S_D$. Thus, both the reduction of electricity consumption and the pattern detection with high accuracy can be realized.

In this manner, the wireless receiver 10B activates the respective constituent elements of the second block BL2 in response to the detection of the power of the received signal. Further, the wireless receiver 10B activates the wireless communicator 110 of the third block BL3 when the predetermined signal pattern is detected from the received signal.

According to the wireless receiver 10B, the second block BL2 and the third block BL3 are activated stepwise in response to each the detection of the power of the received signal and the predetermined signal pattern. Thus, the operation time of the blocks of relatively large electricity consumption can be reduced, and electricity consumption in the receiving standby state can be reduced.

Further, the interference determiner 411 determines the existence/nonexistence of the interference signal $S_I$ influencing on the desired signal $S_D$, based on the intermodulation component. Furthermore, the second block BL2 executes the frequency conversion and the filtering to thereby perform the pattern detection as to the signal from which the influence of the interference signal $S_I$ is removed.

As a result, in the pattern detection, a suitable filter pass band can be selected according to the existence/nonexistence of the interference signal $S_I$. Thus, since the pattern detection performance can be set optimally even under the existence of interference, both the reduction of electricity consumption and the stable activation of the wireless communicator 110 can be realized.

Incidentally, the band variable filter 407 may be configured in a manner that not the filter order but the cut-off bandwidth is changed according to the existence/nonexistence of the interference signal. In this case, also the stability of the activation of the wireless receiver 10B can be improved.

Third Embodiment

Figure 9:
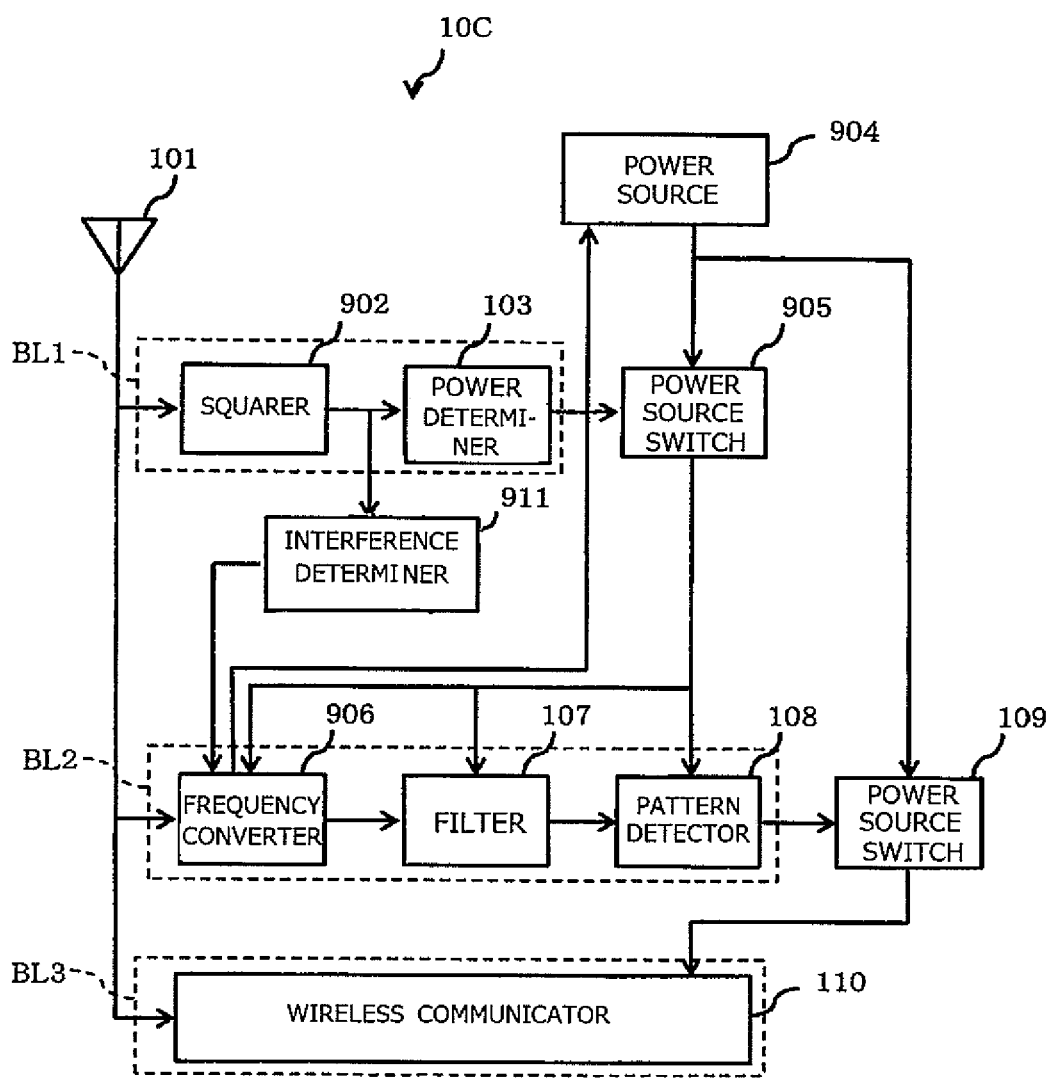
FIG. 9 is a block diagram showing an example of a configuration of a wireless receiver according to a third embodiment.

FIG. 9 is a block diagram showing an example of the configuration of a wireless receiver 10C according to the third embodiment. The wireless receiver 10C includes an antenna 101, a squarer 902, a power determiner 103, a power source 904, a power source switch 905, an accuracy-variable frequency converter 906, a filter 107, a pattern detector 108, a power source switch 109, a wireless communicator 110 and an interference determiner 911. In the wireless receiver 10C, constituent elements identical to those of the wireless receiver 10 shown in FIG. 1 are referred to by the common symbols, with explanation thereof being omitted or simplified.

The squarer 902 inputs the received signal from the antenna 101, then performs the square operation of the received signal and outputs a squared signal to the power determiner 103 and the interference determiner 911.

The power source 904 supplies power to the respective blocks. Incidentally, supply of power to each of the accuracy-variable frequency converter 906, the filter 107 and the pattern detector 108 is controlled by the power source switch 905. Supply of power to the wireless communicator 110 is controlled by the power source switch 109.

The power source 904 inputs a power control signal from the accuracy-variable frequency converter 906 and controls an amount of power to be supplied to the accuracy-variable frequency converter 906 according to the power control signal.

The power source switch 905 inputs the power determination signal from the power determiner 103. The power source switch 905 controls the supply of power from the power source 904 to the accuracy-variable frequency converter 906, the filter 107 or the pattern detector 108 depending on the existence/nonexistence of power of the received signal represented by the power determination signal.

For example, when the power determination signal is "H", the power source switch 905 supplies power to the accuracy-variable frequency converter 906, the filter 107 and the pattern detector 108. In contrast, when the power determination signal is "L", the power source switch 905 does not supply power to any of the accuracy-variable frequency converter 906, the filter 107 and the pattern detector 108.

When the power determiner 103 determines that the power of the received signal exists, the accuracy-variable frequency converter 906 is supplied with power from the power source 904 and starts its operation. The accuracy-variable frequency converter 906 inputs the received signal from the antenna 101 and an interference determination signal from the interference determiner 911. The accuracy-variable frequency converter 906 multiplies the received signal by an LO signal having a predetermined frequency and outputs a down converted signal containing the multiplication result to the filter 107.

The accuracy-variable frequency converter 906 includes, for example, a mixer and an LO signal oscillator. The frequency accuracy of the LO signal generated from the LO signal oscillator differs depending on power (operation power) at the time of operating the LO signal oscillator, that is, power used for frequency conversion. For example, the frequency accuracy of the LO signal becomes high when the operation power of the LO signal oscillator is made large, whilst the frequency accuracy of the LO signal becomes low when the operation power of the LO signal oscillator is made small.

When the interference determination signal represents that interference exists, the accuracy-variable frequency converter 906 outputs, to the power source 904, a power control signal for increasing power supplied to the accuracy-variable frequency converter 906. In contrast, when the interference determination signal represents that interference does not exist, the accuracy-variable frequency converter 906 outputs, to the power source 904, the power control signal for reducing power supplied to the accuracy-variable frequency converter 906. Thus, the operation power of the accuracy-variable frequency converter 906 and the frequency accuracy of the LO signal can be adjusted.

Incidentally, the accuracy-variable frequency converter 906 may include two kinds of LO signal oscillators in a manner that these LO signal oscillators are selectively used according to the existence/nonexistence of interference. The two kinds of LO signal oscillators include a first LO signal oscillator which has large electricity consumption and low frequency accuracy, and a second LO signal oscillator which has small electricity consumption and high frequency accuracy. In this case, also the operation power of the accuracy-variable frequency converter 906 and the frequency accuracy of the LO signal can be adjusted.

The interference determiner 911 inputs a squared signal from the squarer 902, then determines the existence/nonexistence of interference based on the intermodulation component contained in the squared signal and outputs the interference determination signal to the accuracy-variable frequency converter 906. The determination method of interference is same as the determination method performed by the interference determiner 411 explained in the second embodiment.

Next the operation of the accuracy-variable frequency converter 906 will be explained for the respective positional relations between the desired signal $S_D$ and the interference signal $S_I$.

Figure 10:
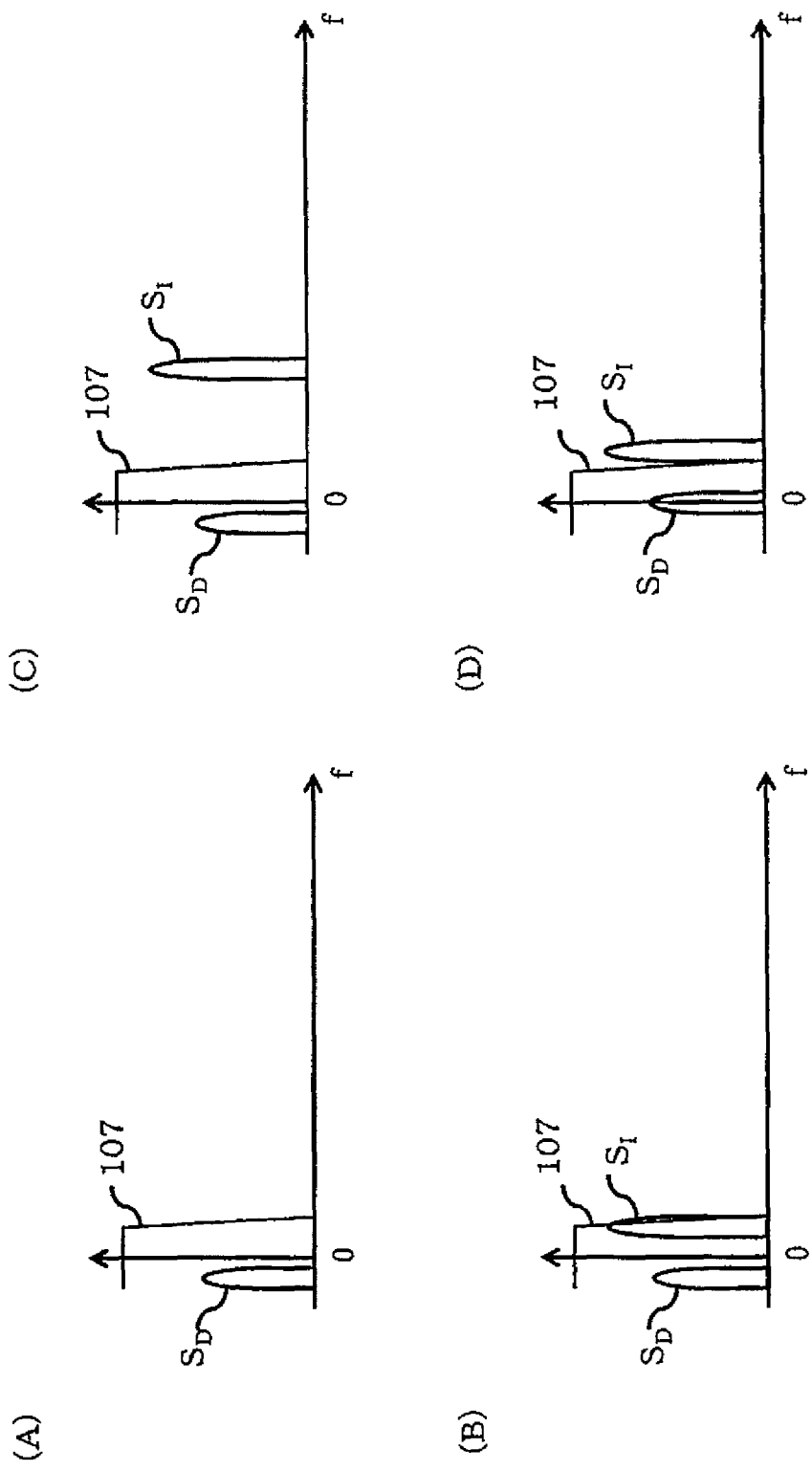
FIG. 10 Each of Section (A) to (D) of FIG. 10 is a schematic diagram showing an example of a frequency spectrum of the received signal and the pass band of a filter, according to the third embodiment.

In Section (A) of FIG. 10, the interference signal $S_I$ does not exist. In this case, sine the interference is not taken into considered, the accuracy-variable frequency converter 906 can set the operation power small and the frequency accuracy low.

The desired signal $S_D$ down-converted by the LO signal generated with low frequency accuracy is converted to a frequency offset from a desired frequency. In this case, when the desired signal $S_D$ is frequency-converted so as to have frequencies within the signal pass band of the filter 107, since the signal component of the desired signal $S_D$ is not lost, the pattern detector 108 can detect the predetermined signal pattern. Thus, the LO signal can be generated with low electricity consumption, and both the reduction of electricity consumption and the pattern detection with high accuracy can be realized.

In Section (B) of FIG. 10, the interference signal $S_I$ exists at a frequency in the vicinity of the frequency allocated to the desired signal $S_D$. The accuracy-variable frequency converter 906 becomes low in the frequency accuracy when the operation power is small. The desired signal $S_D$ down-converted by the LO signal generated with the low frequency accuracy is not down-converted to the desired frequency. Thus, when the interference signal $S_I$ exists within the signal pass band of the filter 107, the pattern detector 108 cannot detect the predetermined signal pattern.

When the operation power of the accuracy-variable frequency converter 906 is increased in the state of Section (B) of FIG. 10, the state transits to a state shown in Section (D) of FIG. 10. In the state of Section (D) of FIG. 10, since the oscillation of the LO signal oscillator is stabilized due to the increase of the operation power, the accuracy-variable frequency converter 906 can down-convert the desired signal $S_D$ so as to have the desired frequency. Accordingly, the filter 107 can remove the interference signal $S_I$ and so the predetermined signal pattern can be detected.

In Section (C) of FIG. 10, the interference signal $S_I$ exists at a frequency separated by a predetermined frequency or more from the frequency allocated to the desired signal $S_p$. In this case, since the interference signal $S_I$ does not particularly influence on the desired signal $S_D$, the accuracy-variable frequency converter 906 can set the operation power small and the frequency accuracy low. The accuracy-variable frequency converter 906 performs the down-conversion by the LO signal generated with low frequency accuracy. Thus, both the reduction of electricity consumption and the pattern detection with high accuracy can be realized.

In this manner, the wireless receiver 10C activates the respective constituent elements of the second block BL2 in response to the detection of the power of the received signal. Further, the wireless receiver 10C activates the wireless communicator 110 of the third block BL3 in response to the detection of the predetermined signal pattern.

According to the wireless receiver 10C, the second block BL2 and the third block BL3 are activated stepwise in response to each the detection of the power of the received signal and the predetermined signal pattern. Thus, the operation time of the blocks of relatively large electricity consumption can be reduced, and electricity consumption in the receiving standby state can be reduced.

Further, the interference determiner 911 determines the existence/nonexistence of the interference signal $S_I$ influencing on the desired signal $S_D$, based on the intermodulation component. Furthermore, the second block BL2 adjusts the operation power of the accuracy-variable frequency converter 906 according to the existence/nonexistence of the interference signal $S_I$, then executes the frequency conversion and the filtering, and detects the pattern in the signal from which the influence of the interference signal $S_I$ is removed.

Thus, in the pattern detection, suitable power and suitable frequency accuracy can be selected according to the existence/nonexistence of the interference signal $S_I$. Accordingly, since the pattern detection performance can be set optimally even under the existence of interference, both the reduction of electricity consumption and the stable activation of the wireless communicator 110 can be realized.

Incidentally, the filter 107 may be configured as the band variable filter 407 shown in the second embodiment. In this case, the second block BL2 may simultaneously control the frequency accuracy of the LO signal and the pass band of the filter according to the existence/nonexistence of the interference signal $S_I$.

Fourth Embodiment

Figure 11:
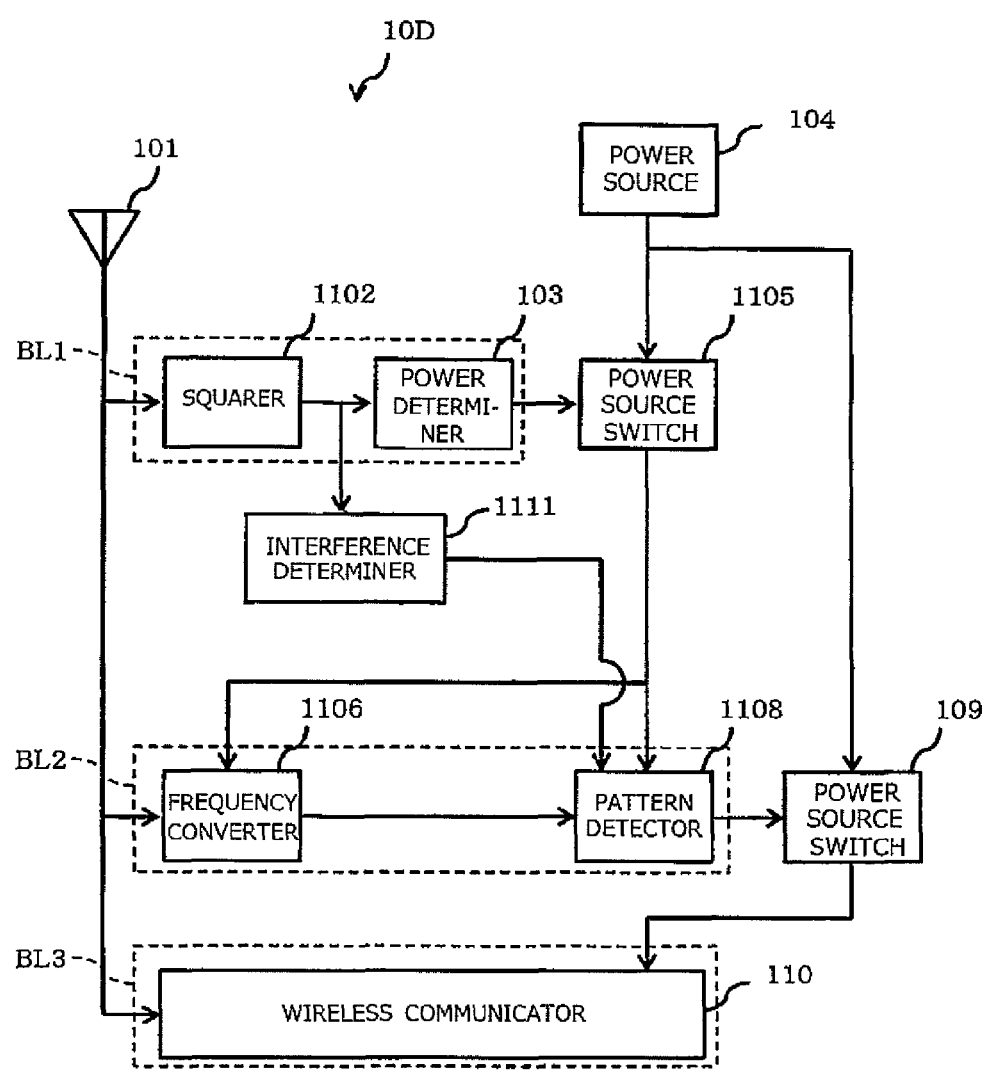
FIG. 11 is a block diagram showing an example of a configuration of a wireless receiver according to a fourth embodiment.

FIG. 11 is a block diagram showing an example of the configuration of a wireless receiver 10D according to the fourth embodiment. The wireless receiver 10D includes an antenna 101, a squarer 1102, a power determiner 103, a power source 104, a power source switch 1105, a frequency converter 1106, a pattern detector 1108, a power source switch 109, a wireless communicator 110 and an interference determiner 1111. In the wireless receiver 10D, constituent elements identical to those of the wireless receiver 10 shown in FIG. 1 are referred to by the common symbols, with explanation thereof being omitted or simplified.

The squarer 1102 inputs the received signal from the antenna 101, then performs the square operation of the received signal and outputs a squared signal to the power determiner 103 and the interference determiner 1111.

The power source switch 1105 inputs the power determination signal from the power determiner 103. The power source switch 1105 controls the supply of power from the power source 104 to the frequency converter 1106 or the pattern detector 1108 depending on the existence/nonexistence of power of the received signal represented by the power determination signal.

For example, when the power determination signal is "H", the power source switch 1105 supplies power to the frequency converter 1106 and the pattern detector 1108. In contrast, when the power determination signal is "L", the power source switch 1105 does not supply power to any of the frequency converter 1106 and the pattern detector 1108.

When the power determiner 103 determines that the power of the received signal exists, each of the frequency converter 1106 and the pattern detector 1108 is supplied with power from the power source 104 and starts its operation.

The frequency converter 1106 inputs the received signal from the antenna 101 and multiplies the received signal by the LO signal having a predetermined frequency and outputs a down converted signal containing the multiplication result to the pattern detector 1108.

The pattern detector 1108 inputs the down converted signal from the frequency converter 1106 and an interference determination signal from the interference determiner 1111. The pattern detector 1108 determines whether or not the down converted signal is the predetermined pattern and outputs a pattern detection signal containing the determination result to the power source switch 109.

Further, the pattern detector 1108 sets parameters (number of quantization bits, number of filter taps, number of filter bits, number of correlation taps or number of correlation bits, for example) used for the pattern detection, according to the interference determination signal.

The interference determiner 1111 inputs the squared signal from the squarer 1102, then determines the existence/nonexistence of interference based on an intermodulation component contained in the squared signal and outputs the interference determination signal to the pattern detector 1108. The determination method of interference is same as the determination method performed by the interference determiner 411 explained in the second embodiment.

Next an example of the configuration of the pattern detector 1108 will be explained.

Figure 12:
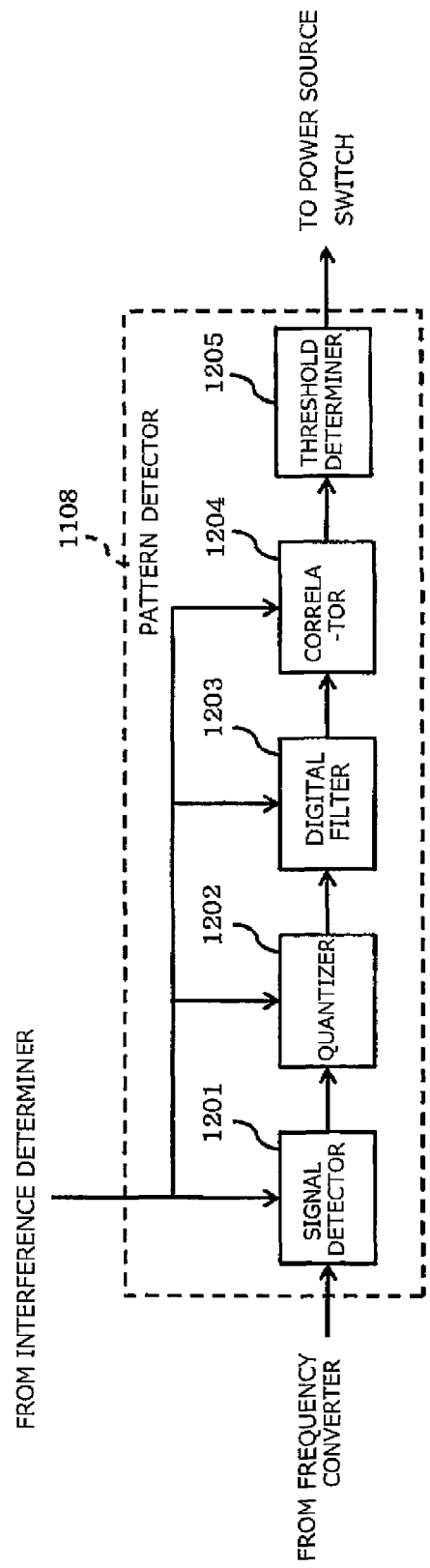
FIG. 12 is a block diagram showing an example of a configuration of a pattern detector according to the fourth embodiment.

FIG. 12 is a block diagram showing an example of the detailed configuration of the pattern detector 1108. The pattern detector 1108 includes a signal detector 1201, a quantizer 1202, a digital filter 1203, a correlator 1204 and a threshold determiner 1205.

The signal detector 1201 inputs the down converted signal from the frequency converter 1106, then detects the down converted signal and outputs a detection signal to the quantizer 1202. For example, in a case of the received signal superimposing information on the amplitude (00K modulation signal, for example), the signal detector 1201 performs the detection according to the existence/nonexistence of power of the received signal. Alternatively, in a case of the received signal superimposing information on the frequency (FSK (Frequency Shift Keying) modulation signal, for example), the signal detector 1201 performs the detection by demodulation.

The quantizer 1202 inputs the detection signal from the signal detector 1201 and the interference determination signal from the interference determiner 1111, then quantizes the detection signal and outputs a quantized signal to the digital filter 1203.

When the interference determination signal represents that interference exists, the quantizer 1202 increases the number of quantization bits. In contrast, when the interference determination signal represents that interference does not exist, the quantizer reduces the number of quantization bits. The pattern detection accuracy can be improved by increasing the number of quantization bits. Electricity consumption of the quantizer 1202 can be reduced by reducing the number of quantization bits.

The digital filter 1203 inputs the quantized signal from the quantizer 1202 and the interference determination signal from the interference determiner 1111. The digital filter 1203 limits the frequency band of the quantized signal to a predetermined band in a digital region, and outputs a band-limited digital signal containing the band-limited result to the correlator 1204.

When the interference determination signal represents that interference exists, the digital filter 1203 increases at least one of the number of filter taps and the number of filter bits each representing the filter order of the digital filter. In contrast, when the interference determination signal represents that interference does not exist, the digital filter 1203 reduces at least one of the number of filter taps and the number of filter bits.

By increasing at least one of the number of filter taps and the number of filter bits, since the attenuation gradient becomes large, the filtering accuracy can be improved and also the pattern detection accuracy can be improved. In contrast, by reducing at least one of the number of filter taps and the number of filter bits, the attenuation gradient becomes small and electricity consumption of the digital filter 1203 can be reduced.

The correlator 1204 inputs the band-limited digital signal from the digital filter 1203 and the interference determination signal from the interference determiner 1111. The correlator 1204 calculates correlation between the predetermined signal pattern and the band-limited digital signal and outputs a correlation value signal containing the calculation result to the threshold determiner 1205.

When the interference determination signal represents that interference exists, the correlator 1204 increases at least one of the number of correlation taps and the number of correlation bits used for the correlation calculation. In contrast, when the interference determination signal represents that interference does not exist, the correlator 1204 reduces at least one of the number of correlation taps and the number of correlation bits.

By increasing at least one of the number of correlation taps and the number of correlation bits, the accuracy of the correlation calculation can be improved and so the pattern detection accuracy can be improved. In contrast, by reducing at least one of the number of correlation taps and the number of correlation bits, electricity consumption of the correlator 1204 can be reduced.

The threshold determiner 1205 inputs the correlation value signal from the correlator 1204 and performs threshold determination using a predetermined value. When a correlation value is a threshold or more, the threshold determiner 1205 determines that the predetermined signal pattern is detected and outputs the pattern detection signal containing the determination result to the power source switch 109.

In this manner, generally, when the value of each of the parameters (number of quantization bits, number of filter taps, number of filter bits, number of correlation taps or number of correlation bits, for example) changing according to the interference determination signal becomes large, the pattern detection accuracy can be improved. On the other hand, generally, when the value of each of the parameters becomes small, electricity consumption can be reduced.

Thus, when the interference signal $S_I$ exists, the interference can be removed and the pattern can be detected with high accuracy by increasing the value of each of the respective parameters. On the other hand, when the interference signal $S_I$ does not exist, both the reduction of electricity consumption and the pattern detection with high accuracy can be realized by reducing the value of each of the respective parameters.

In this manner, the wireless receiver 10D activates the respective constituent elements of the second block BL2 in response to the detection of the power of the received signal. Further, the wireless receiver 10D activates the wireless communicator 110 of the third block BL3 in response to the detection of the predetermined signal pattern.

According to the wireless receiver 10D, the second block BL2 and the third block BL3 are activated stepwise in response to each the detection of the power of the received signal and the predetermined signal pattern. Thus, the operation time of the blocks of relatively large electricity consumption can be reduced, and electricity consumption in the receiving standby state can be reduced.

Further, the interference determiner 1111 determines the existence/nonexistence of the interference signal $S_I$ influencing on the desired signal $S_D$, based on the intermodulation component. Furthermore, the second block BL2 adjusts the respective parameters relating to the pattern detection according to the existence/nonexistence of the interference signal $S_I$, then executes the frequency conversion and the filtering to thereby perform the pattern detection as to the signal from which the influence of the interference signal $S_I$ is removed.

Thus, in the pattern detection, the respective parameters relating to the pattern detection can be suitably selected according to the existence/nonexistence of the interference signal $S_I$. As a result, since the pattern detection performance can be set optimally even under the existence of interference, both the reduction of electricity consumption and the stable activation of the wireless communicator 110 can be realized.

The values of all of the respective parameters (number of quantization bits, number of filter taps, number of filter bits, number of correlation taps or number of correlation bits, for example) relating to the pattern detection may be changed simultaneously according to the interference determination signal. Alternatively, the values of a part of the respective parameters may be changed.

Incidentally, for example, the filter 107 or the band variable filter 407 may be used together with the digital filter contained in the pattern detector 1108.

The second block BL2 may simultaneously control the frequency accuracy of the LO signal and the signal pass band of the filter according to the existence/nonexistence of the interference signal $S_I$, by using the band variable filter 407 and the accuracy-variable frequency converter 906, for example.

This disclosure is not limited to the configurations of the embodiments and applicable to any configuration that can attain the functions recited in claims or the functions provided by the configurations of each of the embodiments.

For example, in each of the embodiments, the received signal may be amplified by using an LNA (Low Noise Amplifier) disposed between the antenna 101 and the squarer 102. Similarly, the received signal may be amplified by using the LNA disposed between the antenna 101 and one of the frequency converter 106, the frequency converter 1106 and the accuracy-variable frequency converter 906. Thus, the detection accuracy of power and the detection accuracy of the pattern can be improved.

In each of the embodiments, the received signal may be used that is modulated by the modulation system (FSK, PSK (Phase Shift Keying), for example) superimposing information on the frequency or the phase in place of the amplitude. In this case, the second block BL2 may demodulate a frequency-converted signal, obtain phase information on a complex plane from the received signal, and detect a signal pattern from the transition of the phase information.

Each of the embodiments employs the direct conversion system, as an example. In the direct conversion system, the wireless receiver converts the received signal of the high-frequency band to the signal with the frequency components having the center frequency 0 (Hz) and performs the filtering using an LPF (Low Pass Filter). However, this disclosure is not limited to the direct conversion system and may employ the Superheterodyne system or the low IF (Intermediate Frequency) system. In the Superheterodyne system, the wireless receiver converts the received signal to a signal of an intermediate frequency band and performs the filtering using a BPF (Band Pass Filter).

In each of the embodiments, low electricity consumption may be realized by stopping the supply of power to the respective constituent elements of the first block BL1 after activating the second block BL2 (pattern detector 108, for example). Alternatively, low electricity consumption may be realized by stopping the supply of power to the respective constituent elements of the first block BL1 and the second block BL2 after activating the third block BL3 (wireless communicator 110). Further, alternatively, low electricity consumption may be realized by stopping the supply of power to the interference determiner 411, 911 or 1111 after activating the third block BL3.

In each of the embodiments, the output of the squarer 102 may be quantized by using, for example, an analog-to-digital converter (ADC) to thereby determine the power of the received signal in a digital manner.

In each of the corresponding embodiments, the interference determiner 411, 911 or 1111 may be contained in the second block BL2. In this case, since electricity consumption can be further reduced by activating the interference determiner 411, 911 or 1111 after detecting the power of the received signal.

In each of the corresponding embodiments, each of the wireless receivers 10B, 10C, 10D may include a plurality of antennas, and select one of the plurality of antennas based on the interference determination signal outputted from the corresponding one of the interference determiners 411, 911 and 1111 so as to select the antenna minimizing the interference signal $S_I$ with respect to the desired signal $S_D$.

In each of the embodiments, although the explanation is made as to the case where this disclosure is configured by the hardware, this disclosure can also be realized by software in combination with hardware.

The respective functional blocks used for explaining the embodiments can typically be realized by an LSI as an integration circuit. These functional blocks may be respectively formed as single chips or may be formed as a single chip so as to include a part of or all the blocks. In this respect, the integration circuit may be called the LSI, or may be called an IC, a system LSI, a super LSI or an ultra LSI depending on the integration degree thereof.

The method of circuit integration is not limited to the LSI and may be realized by a dedicated circuit or a general purpose processor. For example, the circuit integration may be realized by using a FPGA (Field Programmable Gate Array) capable of programming after manufacturing an LSI, the connection of circuit cells within an LSI, or a reconfigurable processor capable of reconfiguring setting.

Further, if a circuit integration technique substituted for the LSI is developed according to the progress of the semiconductor technique or another technique derived therefrom, the functional blocks may of course be integrated by using such the technique. For example, a biotechnology may be applied to the circuit integration.

(Summary of the Mode of this Disclosure)

A first wireless receiver according to this disclosure includes:

a power detector which detects power of a received signal;

a first pattern detector which detects a predetermined signal pattern included in the received signal;

a wireless communicator which performs wireless communication;

a pattern detection activator which activates the first pattern detector when the power detector detects power of the received signal; and a wireless communication activator which activates the wireless communicator when the first pattern detector detects the predetermined signal pattern in the received signal.

In a second wireless receiver according to this disclosure, in the first wireless receiver, the first pattern detector includes:

a frequency converter which converts a frequency of the received signal;

a band limiter which limits a frequency band of the received signal frequency-converted by the frequency converter, in a predetermined frequency band; and a second pattern detector which detects a predetermined signal pattern included in the received signal whose band is limited by the band limiter, and the pattern detection activator activates the frequency converter, the band limiter and the second pattern detector when the power detector detects power of the received signal.

A third wireless receiver according to this disclosure, in the first or the second wireless receiver, further includes an interference determiner which determines existence/nonexistence of an interference signal based on existence/nonexistence of an intermodulation component of a squared signal which is obtained by squaring the received signal, wherein the first pattern detector controls a parameter used by the first pattern detector, based on the existence/nonexistence of the interference signal determined by the interference determiner.

In a fourth wireless receiver according to this disclosure, in the third wireless receiver, the first pattern detector controls an attenuation gradient for limiting the frequency band of the received signal to a predetermined frequency band, according to the existence/nonexistence of the interference signal determined by the interference determiner.

In a fifth wireless receiver, in the third or the fourth wireless receiver, the first pattern detector controls power used for the frequency conversion of the received signal, based on the existence/nonexistence of the interference signal determined by the interference determiner.

In a sixth wireless receiver, in any one of the third to the fifth wireless receiver, the first pattern detector controls a number of quantization bits of the received signal based on the existence/nonexistence of the interference signal determined by the interference determiner.

In a seventh wireless receiver, in any one of the third to the sixth wireless receiver, the first pattern detector controls at least one of the number of correlation taps and the number of correlation bits used for a correlation calculation between a pattern included in the received signal and the predetermined signal pattern, based on the existence/nonexistence of the interference signal determined by the interference determiner.

A wireless receiving method according to this disclosure is a wireless receiving method in a wireless receiver, the method including the steps of:

detecting power of a received signal;

activating a pattern detector which detects a predetermined signal pattern included in the received signal, when power of the received signal is detected; and activating a wireless communicator which performs wireless communication, when the predetermined signal pattern is detected from the received signal.

Although this disclosure has been explained in detail with reference to the particular embodiments, it will be apparent for those skilled in the art that various changes and modifications can be made without departing from the spirit and range of this disclosure.

This disclosure is based on Japanese Patent Application No. 2013-052225 filed on Mar. 14, 2013, the content of which is incorporated herein by reference.

INDUSTRIAL APPLICABILITY

This disclosure is useful for the wireless receiver and the wireless communication method etc. each of which can realize both the reduction of electricity consumption and the stable activation.

REFERENCE SIGNS LIST 10, 10B, 10C, 10D wireless receiver
101 antenna
102 squarer
103 power determiner
104 power source
105 power source switch
106 frequency converter
107 filter
108 pattern detector
109 power source switch
110 wireless communicator
402 squarer
405 power source switch
407 band variable filter
411 interference determiner
411B interference determination filter
902 squarer
904 power source
905 power source switch
906 accuracy-variable frequency converter
911 interference determiner
1102 squarer
1105 power source switch
1106 frequency converter
1108 pattern detector
1111 interference determiner
1201 signal detector
1202 quantizer
1203 digital filter
1204 correlator
1205 threshold determiner

The invention claimed is:

1. A wireless receiver comprising:
a power detector which detects power of a received signal;
a pattern detector including:
   a frequency converter which converts a frequency of the received signal;
   a band limiter which limits a frequency band of the received signal frequency-converted by the frequency converter, in a predetermined frequency band; and
   a detector which detects a predetermined signal pattern included in the received signal whose band is limited by the band limiter;
a wireless communicator which performs wireless communication;
a pattern detection activator which activates the frequency converter, the band limiter, and the detector when the power detector detects the power of the received signal; and
a wireless communication activator which activates the wireless communicator when the detector detects the predetermined signal pattern in the received signal.

2. The wireless receiver according to claim 1, further comprising:
an interference determiner which determines existence/nonexistence of an interference signal based on existence/nonexistence of an intermodulation component of a squared signal which is obtained by squaring the received signal, wherein
the pattern detector controls a parameter used by the pattern detector, based on the existence/nonexistence of the interference signal determined by the interference determiner.

3. The wireless receiver according to claim 2, wherein the pattern detector controls an attenuation gradient for limiting the frequency band of the received signal to the predetermined frequency band, according to the existence/nonexistence of the interference signal determined by the interference determiner.

4. The wireless receiver according to claim 2, wherein the pattern detector controls power used for the frequency conversion of the received signal, based on the existence/nonexistence of the interference signal determined by the interference determiner.

5. The wireless receiver according to claim 2, wherein the first pattern detector controls a number of quantization bits of the received signal based on the existence/nonexistence of the interference signal determined by the interference determiner.

6. The wireless receiver according to claim 2, wherein the pattern detector controls at least one of a number of correlation taps and a number of correlation bits used for a correlation calculation between a pattern included in the received signal and the predetermined signal pattern, based on the existence/nonexistence of the interference signal determined by the interference determiner.

7. A wireless receiving method in a wireless receiver, the method comprising the steps of:
detecting power of a received signal;
activating a pattern detector when the power of the received signal is detected, the activating of the pattern detector including:
   converting, by a frequency converter, a frequency of the received signal;
   limiting, by a band limiter, a frequency band of the received signal frequency-converted by the frequency converter, in a predetermined frequency band; and
   detecting, by a detector, a predetermined signal pattern in the received signal whose band is limited by the band limiter; and
activating a wireless communicator which performs wireless communication, when the detector detects the predetermined signal pattern included in the received signal.

8. The wireless receiving method according to claim 7, further comprising:
determining existence/nonexistence of an interference signal based on existence/nonexistence of an intermodulation component of a squared signal which is obtained by squaring the received signal; and
controlling a parameter used by the pattern detector, based on the existence/nonexistence of the interference signal.

9. The wireless receiver according to claim 8, further comprising controlling an attenuation gradient for limiting the frequency band of the received signal to the predetermined frequency band, according to the existence/nonexistence of the interference signal.

10. The wireless receiver according to claim 8, further comprising controlling power used for the frequency conversion of the received signal, based on the existence/nonexistence of the interference signal.

11. The wireless receiver according to claim 8, further comprising controlling a number of quantization bits of the received signal based on the existence/nonexistence of the interference signal.

12. The wireless receiver according to claim 8, further comprising controlling at least one of a number of correlation taps and a number of correlation bits used for a correlation calculation between a pattern included in the received signal and the predetermined signal pattern, based on the existence/nonexistence of the interference signal.

* * * * *